(12) United States Patent
Lau et al.

(10) Patent No.: US 7,915,517 B2
(45) Date of Patent: Mar. 29, 2011

(54) BIFACIAL PHOTOVOLTAIC DEVICES

(76) Inventors: Po K. Lau, Outremont (CA); Ishiang Shih, Brossard (CA); Cindy X. Qiu, Brossard (CA); Chunong Qiu, Brossard (CA)

( * ) Notice: Subject to any disclaimer, the term of this patent is extended or adjusted under 35 U.S.C. 154(b) by 865 days.

(21) Appl. No.: 11/504,308

(22) Filed: Aug. 16, 2006

(65) Prior Publication Data
US 2008/0041436 A1   Feb. 21, 2008

(51) Int. Cl.
*H01L 31/00* (2006.01)
(52) U.S. Cl. .......... 136/244; 136/255; 136/256
(58) Field of Classification Search ........... 136/243–265
See application file for complete search history.

(56) References Cited

U.S. PATENT DOCUMENTS

| | | | |
|---|---|---|---|
| 2,001,672 A | 5/1935 | Carpenter | |
| 3,278,811 A | 10/1966 | Mori | |
| 3,948,682 A | 4/1976 | Bordina et al. | |
| 3,976,508 A * | 8/1976 | Mlavsky | 136/246 |
| 3,990,101 A | 11/1976 | Ettenberg et al. | |
| 4,196,623 A | 4/1980 | Alinari | |
| 4,355,196 A | 10/1982 | Chai | |
| 5,268,039 A * | 12/1993 | Vogeli et al. | 136/256 |
| 6,403,877 B2 | 6/2002 | Katsu | |
| 7,053,294 B2 | 5/2006 | Tuttle et al. | |
| 7,196,262 B2 * | 3/2007 | Gronet | 136/246 |

OTHER PUBLICATIONS

R. Hezel, Novel Back contact Silicon Solar Cells Designed for Very High Efficiencies and Low-cost Mass Production, 29th IEEE Photovoltaic Specialists Conf., New Orleans, Louis.
D.L. Young, et al, A New Thin-Film CuGaSe2/Cu(In,Ga)Se2 Bifacial, Tandem Solar Cell with Both Junctions formed Simultaneously, 29th IEEE PV Specialists Conf., New Orleans, Lou.

* cited by examiner

*Primary Examiner* — Jeffrey T Barton

(57) ABSTRACT

This invention provides a bifacial photovoltaic device to enhance the conversion of solar energy into electricity with a layer by layer additive structure. The bifacial photovoltaic device comprises an electrically conductive core electrode, a plurality of semiconductor layers covering one end region of the core electrode and at least a portion of the two faces of the core electrode, a first counter electrode, a second counter electrode, and a third counter electrode connecting the first and the second counter electrodes. The device may also comprise a light reflective layer and an anti-reflective layer. This invention also provides an array of bifacial photovoltaic cells with simple interconnection schemes.

9 Claims, 4 Drawing Sheets

Prior Art

BIFACIAL PHOTOVOLTAIC DEVICES

BACKGROUND OF THE INVENTION

1. Field of Invention

This invention provides a bifacial photovoltaic device structure to absorb lights coming from either side.

2. Prior Arts

Since the first published photovoltaic effect by a French scientist Edmund Becquerel in 1839, the quest to improve photovoltaic cell performance has begun.

Through better light absorption, U.S. Pat. No. 2,001,672 to Carpenter (1930) discloses ways to increase solar cell efficiency by incorporating a back reflector layer. Since then, much efforts have been focusing on improving single-sided solar cell with one light absorption face (for example, U.S. Pat. No. 3,990,101 to Ettenberg et al. (1976), U.S. Pat. No. 4,196,623 to Shay et al. (1980), U.S. Pat. No. 4,355,196 to Chai (1982), and U.S. Pat. No. 7,053,294 to Tuttle et al. (2006)).

In circumstance when light shines on the back side of such single-sided solar cells, no electricity would be generated. This poses problems to applications employing solar cells that cannot move to track lights. Although it is possible to incorporate a light tracking mechanism to solar cell panels, the adoption of such light tracking mechanism increases cost of the electricity generation system.

U.S. Pat. No. 3,278,811 to Mori (1966) discloses a radiant energy transducer which is sensitive to radiation incident on either side of the transducer. However, given electron's limited diffusion length in semiconductors, thickness of the device has to be very small. Hence, such design is not practical in larger surface area photovoltaic application. Otherwise, device has to use complicated material structure as disclosed in U.S. Pat. No. 3,948,682 to Bordina et al. (1976) which is costly to produce.

Process improvement has been described by R. Hezel "Novel Back Contact Silicon Solar Cells Designed for Very High Efficiencies and Low-cost Mass Production" (2002) to lower cost of production. However, his device structure still requires semiconductor material to be selectively added and subtracted in high precision which are costly. In addition, devices based upon bulk silicon semiconductor material, disclosed in U.S. Pat. No. 6,403,877 to Katsu (2002), are heavy and fragile to handle.

Alternatively, semiconductor layers in a bifacial solar cell can be formed simultaneously as described by D. L. Young, J. Abushama, R. Noufi, X. Li, J. Keane, T. A. Gessert, J. S. Ward, M. Contreras, M. Symko-Davies and T. J. Coutts "A New Thin-Film $CuGaSe_2/Cu(In,Ga)Se_2$ Bifacial, Tandem Solar Cell with Both Junctions Formed Simultaneously" (2002). However, their structure requires four electrical terminals thus making it cumbersome and costly to interconnect.

From the above description, it is evident that novel bifacial photovoltaic cells with simplified structure for interconnection and fabrication will be valuable for photovoltaic applications.

Objectives and Advantages

A bifacial solar cell absorbs light coming from either side, making it useful to applications where solar panels cannot move to track light and require enhanced solar to electric power conversion efficiency. What is more, it can take advantage of lights reflected back from background, thus increasing its electricity generating effectiveness. The main objectives and advantages of the present invention are:

(a) to provide a bifacial photovoltaic device structure with a strategically placed core electrode that facilitates direct diffusion of electrical charges to its adjacent electrodes, liberating the size constraint on solar cell by its charge diffusion length;

(b) to provide a simple and logical layer-by-layer additive device structure that favors efficient material usage and automation, thus cheaper to produce; and (c) to provide a simplified interconnection scheme to a bifacial photovoltaic device with electrical terminals on the two ends, allowing electrical interconnections be made shingle-style (like roof tiles) without the need of extra wiring.

Further objectives and advantages of this invention include the usage of a thin piece of electrically conductive core electrode and thin layers of semiconductor to form a light-weight, flexible and non-fragile bifacial photovoltaic device. Another objective of this invention is to provide an anti-reflective coating on the surfaces of the bifacial photovoltaic device. Yet another objective is to provide a light reflective core beneath semiconductor layers to further enhance the device's efficiency through better light absorption.

SUMMARY

In accordance with the present invention a bifacial photovoltaic device comprises an electrically conductive and light reflective core, a plurality of semiconductor layers, a system of current collecting surface electrodes and an antireflective layer.

DRAWINGS—FIGURES

Figure 5A:
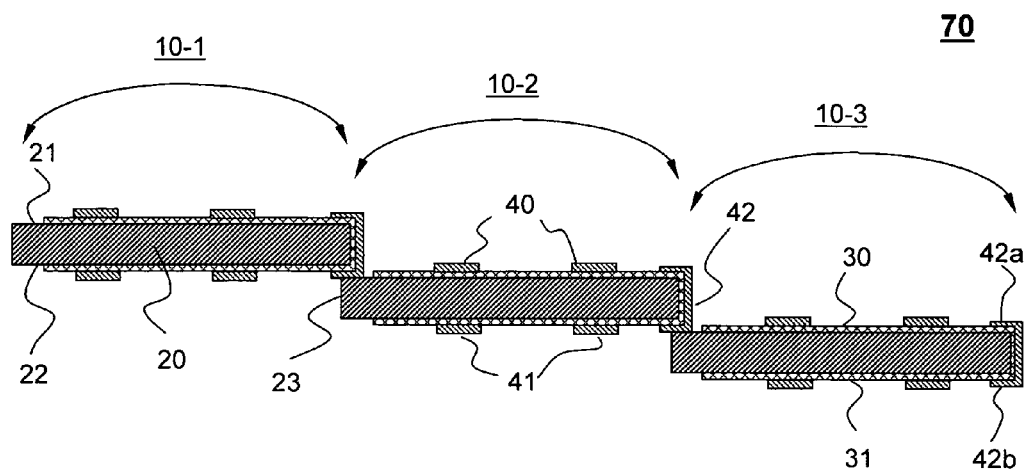
Figure 5B:
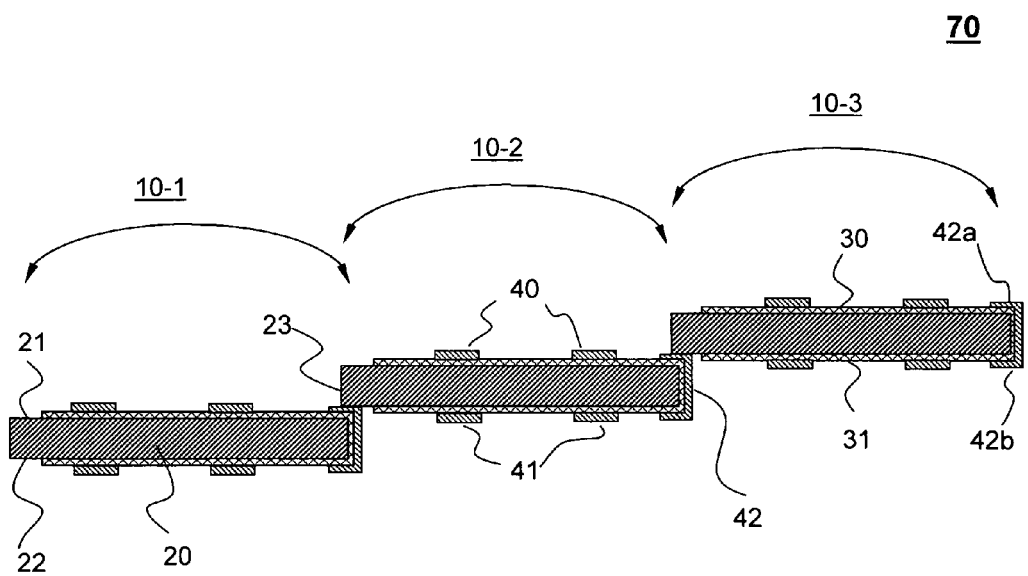

FIGS. 5(a) and 5(b) show views of a bifacial photovoltaic array (70) formed by interconnecting three bifacial photovoltaic devices (10-1, 10-2 and 10-3) using a simple shingle-style technique.

DRAWINGS—REFERENCE NUMERALS

| | | | |
|---|---|---|---|
| 1, 2, 3 | prior art bifacial photovoltaic cell | 10, 10', 10" | bifacial photovoltaic device |
| 20 | core electrode | 21 | first face of core electrode |
| 22 | second face of core electrode | 23 | first end region |
| 24 | second end region | 30 | first semiconductor layers |
| 31 | second semiconductor layers | 32 | third semiconductor layers |
| 33 | first absorption layer | 34 | first buffer layer |
| 35 | first window layer | 36 | second absorption layer |
| 37 | second buffer layer | 38 | second window layer |
| 40 | first counter electrode | 41 | second counter electrode |
| 42 | third counter electrode | 43 | end insulating layer |
| 50 | first incident light | 51 | second incident light |
| 60, 61 | first, second reflective layer | 62, 63 | first, second antireflective layer |
| 64, 65 | first, second protective layer | 70 | bifacial photovoltaic array |

DETAILED DESCRIPTION

Prior Art

Figure 1A:
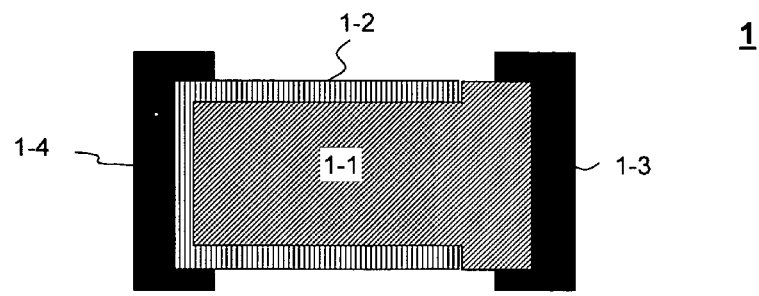
FIG. 1 shows prior arts bifacial photovoltaic devices: (a) with size constraint, (b) complicated material and (c) complex terminals.

In a prior art bifacial photovoltaic cell (1) based on silicon as shown in FIG. 1(a) described in U.S. Pat. No. 3,278,811 granted to Mori (1966), where (1-1) is p-type silicon, (1-2) is n-type silicon, (1-3) and (1-4) are electrodes. Electrons generated near the positive electrode (1-3) have to diffuse a great distance as compare to electrons generated close to the negative electrode (1-4). Hence, electron diffusion length in the prior art silicon bifacial photovoltaic cell (1) limits the size of the device and it is not practical for large area photovoltaic applications.

Figure 1B:
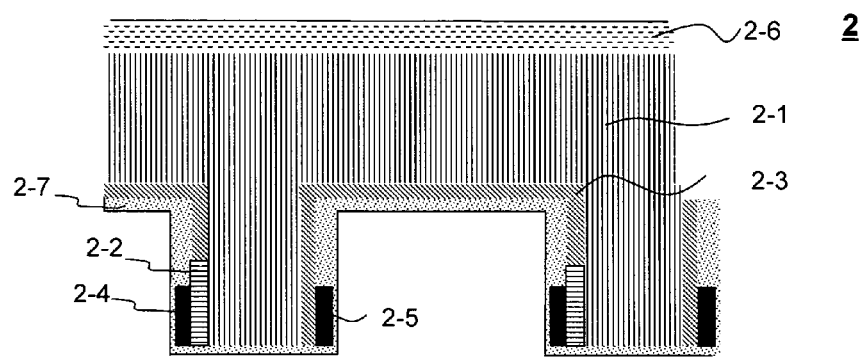

Another prior art back contact bifacial device structure (2) as shown in FIG. 1(b) by R. Hezel ("Novel Back Contact Silicon Solar Cells Designed for Very High Efficiencies and Low-cost Mass Production" (2002)) may be advantageously used to remediate the charge diffusion limitation imposed by silicon and to facilitate production. The structure (2) is based upon p-type bulk silicon (2-1) having isolated patches of p+ region (2-2), n+ inverted layer (2-3), p-contact (2-4) and n-contact (2-5), along the bottom inner side of the device (2), where (2-6) is the front passivation layer and (2-7) is the back passivation layer. However, the device requires semiconductor material to be selectively added and subtracted in high precision which are costly.

Figure 1C:
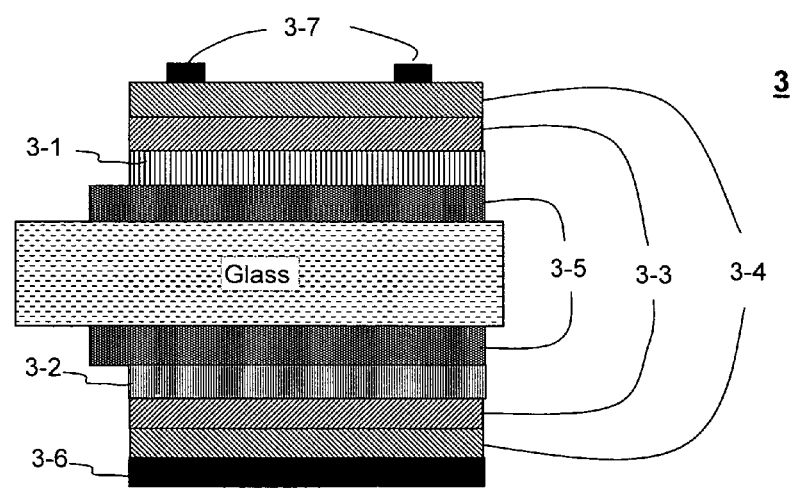

FIG. 1(c) shows a prior art thin film bifacial solar cell (3) (D. L. Young, J. Abushama, R. Noufi, X. Li, J. Keane, T. A. Gessert, J. S. Ward, M. Contreras, M. Symko-Davies, and T. J. Coutts, *A New Thin-Film CuGaSe$_2$/Cu(In,Ga)Se$_2$ Bifacial, Tandem Solar Cell with Both Junctions Formed Simultaneously*) having four terminals (3-5, 3-6, and 3-7). In this heterojunction structure, (3-1) and (3-2) are CuGaSe$_2$ and Cu(InGa)Se$_2$ absorber layers, (3-3) are CdS buffer layers, (3-4) are ZnO window layers. Two SnO$_2$ transparent conductive coatings (3-5) act as two terminals while the back and front electrodes (3-6, 3-7) represent the other two terminals of the cell (3). In order to achieve sufficient output voltage, several solar cells are required to be connected in series. Due to the need to connect the electrodes in the front side of a cell to the electrodes in the back side of an adjacent cell, it is obvious that interconnection of the prior art thin film bifacial cell (3) is complicated. The complexity in external electrical connection would impede on the usability of this solar cell design.

Preferred Embodiments

Figure 2A:
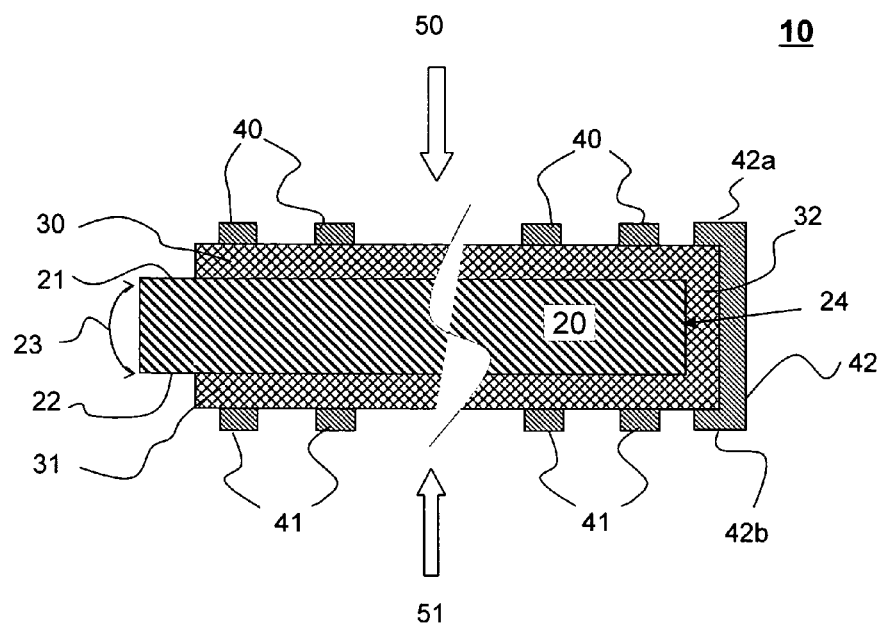
FIG. 2 (a) shows a schematic sectional view of a bifacial photovoltaic device (10) and (b) is the schematic sectional view of the first semiconductor layers (30) and the second semiconductor layer (31), showing the structure of the first and the second semiconductor layers (30, 31).

One preferred embodiment of the bifacial photovoltaic device (10) according to this invention is illustrated in sectional views in FIG. 2(a). The device (10) has an electrically conductive substrate acting as a core electrode (20) of the device (10). This core electrode (20) has a first face (21), a second face (22), a first end region (23) and a second end region (24). The core electrode (20) is enveloped by uniform layers of semiconductor materials except on the first end region (23), leaving an exposed core electrode portion to be used as a first electrical terminal of the device (10). Material examples of the core electrode (20) include but not limited to stainless steel, aluminum, copper brass, nickel, iron, alloys and combinations of alloys. This metal core electrode (20) may be rigid or flexible. When thin metal sheets are used for the core electrode (20), the core electrode (20) can be lightweigh, non-fragile and flexible. This core electrode (20) can also be an insulator (glass, plastic and ceramic) covered by electrically conductive layers in its entirety.

The semiconductor layers (30, 31, 32) consist of first semiconductor layers (30) covering the first face (21) of the core electrode (20) (forming the first face of the biracial photovoltaic device (10)), second semiconductor layers (31) covering the second face (22) of the core electrode (20) (forming the second face of the biracial photovoltaic device (10)) and third semiconductor layers (32) covering the second end region (24) of the core electrode (20) and connecting (30) and (31). A group of electrode grids is deposited on the surface of the first semiconductor layers (30) to form the first counter electrode (40) and a group of electrode grids is deposited on the surface of the second semiconductor layers (31) to form the second counter electrode (41). The first and the second counter electrodes (40, 41) are electrically connected through a third counter electrode (42). The third counter electrode (42), having a first face (42a) and a second face (42b), also functions as the second electrical terminal of the biracial photovoltaic device (10) and is there to collect the opposite electrical charges.

The first, second and third semiconductor layers (30, 31 and 32) comprise no less than two layers of semiconductor thin films. In the case of homojunctions, the first, second and third semiconductor layers (30, 31 and 32) consist of at least two functional layers (a p-type layer and an n-type layer) of the same semiconductor material.

Figure 2B:
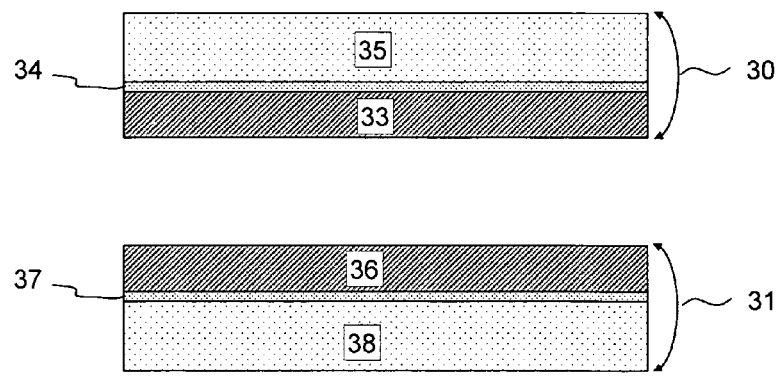

In the case of heterojunction solar cells, the semiconductor layers (30, 31 and 32) contain at least two functional layers (a p-type layer and an n-type layer) of different semiconductor materials. In most cases, the first semiconductor layers (30) consist of a first absorption layer (33), a first buffer layer (34) and a first window layer (35), as shown in FIG. 2(b). The first semiconductor layers (30) together with the core electrode (20) and the first counter electrode (40) form the top cell in the bifacial cell (10). Similarly, the second semiconductor layers (31) consist of a second absorption layer (36), a second buffer layer (37) and a second window layer (38). The core electrode (20), the second semiconductor layer (31) and the second counter electrode (41) form the bottom cell in the bifacial cell (10). Hence, in accordance with one embodiment of this invention, since the top cell and the bottom cell are sharing the same core electrode (20) and since the third counter electrode (42) connects the first and second counter electrodes (40) and (41), the top cell and the bottom cell in this bifacial photovoltaic device (10) is in effect a single cell. The presence of the core electrode (20) and the third counter electrode (42) therefore allow a single cell to have bifacial characteristics.

The first and the second absorption layers (33) and (36) can be selected from a group of a single crystalline material, a polycrystalline material or an amorphous material. Examples of the materials include but not limited to silicon (Si), gallium arsenide (GaAs), cadmium telluride (CdTe), copper indium selenide ($CuInSe_2$), copper indium-gallium selenide ($CuInGaSe_2$), cadmium telluride (CdTe), indium phosphide (InP) and any combination of two or three. The materials of the first and the second buffer layers (34) and (37) are selected from a group including but not limited to hydroxide, oxide, sulfide and selenide. Examples of the first and the second window layers (35) and (38) include but not limited to oxide, sulfide, selenide and their combinations.

The materials in the first semiconductor layers (30), the second semiconductor layers (31) and the third semiconductor layers (32) can be selected to be the same or to be different. When the same material is selected for each functional layer in (30, 31 and 32) (e.g. p-type $CuInSe_2$ for absorption layers in (30), (31) and (32)), they can be prepared in the same fabrication run simultaneously. This is especially advantageous when solution process techniques are adopted for the fabrication of the semiconductor layers. For example, the first and the second absorption layers (33 and 36) and the third absorption layer (not shown) can be deposited simultaneously on to the first and second faces (21, 22) and the second end region (24) of the core electrode (20) by an electrodeposition method. The first and the second buffer layers (34 and 37) and the third buffer layer (not shown) can be prepared on to the absorption layers using a chemical bath deposition process. In a similar fashion, the first and the second window layers (35 and 38) and the third window layer (not shown) can be deposited by a sol-gel method. The first, second and third semiconductor layers can also be fabricated by other solution methods (LPE, spray pyrolysis, screen printing etc.) or non-solution methods (evaporation, sputtering, CVD etc.).

When a first incident light (50, FIG. 2(a)) shines on the first semiconductor layers (30) deposited on the first face (21) of the core electrode (20) and captured in the first semiconductor layers (30), electron-hole pairs are generated. The generated electron-hole pairs diffuse directly into their respective electrodes (20) and (40) and create an electric potential across the core electrode (20) and the first counter electrodes (40). Since the third counter electrode (42) is electrically connected to the first counter electrode (40), when an external circuit is connected to the first electrical terminal (or the first end region) (23) and the second electrical terminal (or the third counter electrode) (42) correctly, electric current would flow from the higher potential terminal to the lower potential terminal.

In a similar fashion, a second incident light (51, FIG. 2(a)) incidents on the second semiconductor layers (31) and captured in the second semiconductor layers (31) to generate electron-hole pairs. The generated electron-hole pairs diffuse directly into their respective electrodes (20) and (41) and create an electric potential across the core electrode (20) and the second counter electrode (41). Since the third counter electrode (42) is electrically connected to the second counter electrode (41), when an external circuit is correctly connected to the first electrical terminal (23) and the second electrical terminal (42), electric current would flow from the high potential electrical terminal to the low potential electrical terminal.

Figure 3:
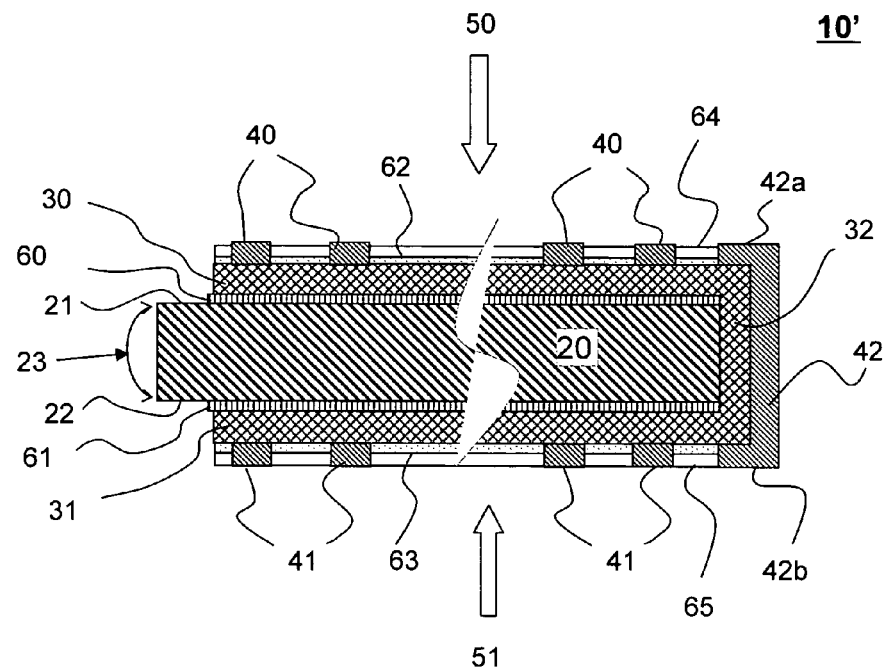
FIG. 3 shows a schematic sectional view of the bifacial photovoltaic device (10') equipped with light reflective layers on the core electrode and anti-reflective layers on the semiconductor layers.

FIG. 3 shows a device (10') according to this invention having a first light reflective layer (60) on the first face (21) of the core electrode (20) and underneath the first semiconductor layers (30), a second light reflective layer (61) in between the second face (22) of the core electrode (20) and the second semiconductor layers (31), an first antireflective layer (62) on top of the first semiconductor layers (30) and a second antireflective layer (63) on the second semiconductor layers (31). The first and second light reflective layers (60, 61) reflect light back to the first and the second semiconductor layers (30, 31) respectively, providing a second chance for light absorption to create further electron-hole pairs. At the same time, any residual light unabsorbed in the semiconductor layers (30, 31) would be reflected out of the device (10') without being transformed into heat, thus keeping the device cool. It should be noted that a photovoltaic device would have higher electricity generation efficiency when operating at lower temperatures. When the first face (21) and the second face (22) of the core electrode (20) are of mirror-like finishing, the reflective layers (60, 61) can be eliminated. The antireflective layers (62, 63) on semiconductor layers (30, 31) lessen reflection on device's surface and therefore allow more light to enter into the device (10'). Thickness and materials of the first and second antireflective layers (62, 63) may be selected according to the reflective index and the peak wavelength value of the solar spectrum where reflection needs to be minimized.

According to another embodiment of this invention, a first protective layer (64) is applied on the first antireflective layer (62) or directly on the first semiconductor layers (30) as protection layer against damage and environment contamination. Similarly, a second protective layer (65) is applied on the second antireflective layer (63) or directly on the second semiconductor layers (31) as protection layer. The materials for the protective layers (64, 65) need to be transparent to solar spectrum and sufficiently stable in various environments. Examples of the materials include: oxides, nitrides and organic materials or their mixtures.

Figure 4:
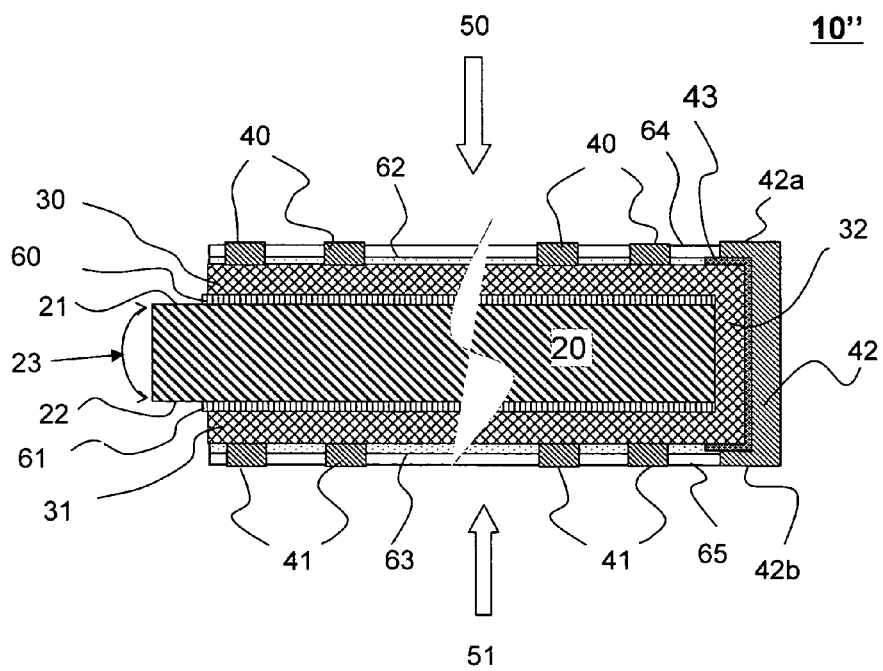
FIG. 4 shows a schematic sectional view of the bifacial photovoltaic device (10") with an end insulating layer (43) to prevent shorting between the third counter electrode (42) and the core electrode (20).

According to still another embodiment of this invention, an end insulating layer (43) (see FIG. 4) can also be added in a bifacial cell (10"), to prevent any electrical shorting between the third counter electrode (42) and the core electrode (20). This end insulating layer (43) is located between the third semiconductor layers (32) and the third counter electrode (42). Some material examples of this end insulating layer (34) include but not limited to epoxy, polyimide, silicon oxide, silicon nitride or their mixtures. The end insulating layer (43) can be prepared conveniently, before the deposition of the counter electrodes (40, 41 and 42), by a simple solution method.

According to yet another embodiment of this invention, a plurality of bifacial photovoltaic devices (10) may be connected in series to form a bifacial photovoltaic array (70) as shown in FIG. 5 to increase the open circuit voltage upon illumination. The electrical interconnection between the bifacial photovoltaic devices in this bifacial photovoltaic array (70) may be conveniently achieved by getting in touch with each other in a way similar to shingles on a roof. Specifically, as shown in FIG. 5(a), a series electrical connection between a first bifacial device (10-1) and a second bifacial device (10-2) is made by making contact between a portion of the second face (42b) of the third counter electrode (42) in the first bifacial device (10-1) and a portion of the first face (21) of the core substrate (20) (in its exposed first end region (23)) in the second bifacial device (10-2). The series electrical connection between the second bifacial device (10-2) and a third bifacial device (10-3) is made by making contact between a portion of the second face (42b) of the third counter electrode (42) in the second bifacial device (10-2) and a portion of the first face (21) of the core substrate (20) (in its exposed first end region (23)) of the third bifacial device (10-3). This unique interconnection method does not employ extra metal pieces for tabbing as in contemporary crystalline silicon solar cells. In order to reduce the contact resistance between adjacent bifacial devices, conductive epoxy such as the one containing Al or Ag or solder alloys may also be applied on the second face (42b) of the third counter electrode (42) and the first face (21) of the core electrode (20).

Similarly, a bifacial photovoltaic array (70) to increase the open circuit voltage can also be made by connecting in series a plurality of bifacial photovoltaic cells, as shown in FIG. 5(b), in which the electrical connection between a first bifacial cell (10-1) and a second bifacial cell (10-2) is made by making contact between a portion of the first face (42a) of the third counter electrode (42) in the first bifacial cell (10-1) and a portion of the second face (22) of the core substrate (20) (in its exposed first end region (23)) in the second bifacial cell (10-2). The electrical connection between the second bifacial cell (10-2) and a third bifacial cell (10-3) is made by making contact between a portion of the first face (42a) of the third counter electrode (42) in the second bifacial cell (10-2) and a portion of the second face (22) of the core substrate (20) (in its exposed first end region (23)) in the third bifacial cell (10-3). In order to reduce the contact resistance between adjacent bifacial cells, conductive epoxy such as the one containing Al or Ag or solder alloys may also be applied on the first face (42a) of the third counter electrode (42) and the second face (22) of the core electrode (20).

Conclusion, Ramification and Scope

Accordingly, it will be obvious to a person skillful in the photovoltaic arts that the novel bifacial photovoltaic device structure according to this invention can be used to harvest light into electricity effectively and economically as described in the above description with the associated drawings.

Although the description above contains many specificities and examples, these should not be construed as limiting the scope of the invention but as merely providing illustrations of some of the preferred embodiments of this invention. For example, the bifacial photovoltaic device can have other shapes, such as rectangular, trapezoidal, triangular, etc., the core electrode can have different sizes, thickness and mechanical properties.

Thus the scope of the invention should be determined by the appended claims and their legal equivalents, rather than by the examples given.

What is claimed is:

1. A planar bifacial photovoltaic device to absorb lights coming from either side comprises:
    an electrically conductive planar core electrode sheet with a first face, a second face, a first end region and a second end region;
    a plurality of semiconductor layers covering said second end region and at least a portion of said first face and at least a portion of said second face, exposing said first end region of said planar core electrode sheet, said plurality if semiconductor layers including first semiconductor layers on said first face and second semiconductor layers on said second face and third semiconductor layers on said second end region of said planar core electrode sheet;
    a first counter electrode for current collection on said first semiconductor layers;
    a second counter electrode for current collection on said second semiconductor layers; and
    a third counter electrode on said third semiconductor layers electrically connecting said first counter electrode and said second counter electrode, said third counter electrode having a first face and a second face.

2. A planar bifacial photovoltaic device as defined in claim 1, further comprises a first reflective layer deposited in between said first face of said planar core electrode sheet and said first semiconductor layers, and a second reflective layer deposited in between said second face of said planar core electrode sheet and said second semiconductor layers.

3. A planar bifacial photovoltaic device as defined in claim 1, further comprising a first antireflective layer on said first semiconductor layers and said first counter electrode, and a second antireflective layer on said second semiconductor layers and said second counter electrode.

4. A planar bifacial photovoltaic device as defined in claim 1, further comprising a first protective layer on said first semiconductor layers and said first counter electrode, and a second protective layer on said second semiconductor layers and said second counter electrode.

5. A planar bifacial photovoltaic device as defined in claim 1, further comprise an end insulating layer deposited between said third semiconductor layers and said third counter electrode to prevent electrical shorting.

6. A planar bifacial photovoltaic device as defined in claim 1, wherein materials of said first semiconductor layers, said second semiconductor layers and said third semiconductor layers are selected from the group consisting of: single crystalline semiconductors, polycrystalline semiconductors and amorphous semiconductors and their mixtures.

7. A planar bifacial photovoltaic device as defined in claim 1, wherein said first semiconductor layers, said second semiconductor layers and said third semiconductor layers are fabricated sequentially by: electrodeposition, chemical bath deposition, sol gel deposition, spray pyrolysis, or screen printing.

8. A bifacial photovoltaic array with simplified interconnections comprises a plurality of planar bifacial photovoltaic devices; each of said planar bifacial photovoltaic devices consists of:
    an electrically conductive planar core electrode sheet with a first face, a second face, a first end region and a second end region;
    a plurality of semiconductor layers covering said second end region and at least a portion of said first face and at least a portion of said second face, exposing said first end region of said planar core electrode sheet, said plurality of semiconductor layers including first semiconductor layers on said first face and second semiconductor layers on said second face and third semiconductor layers on said second end region of said planar core electrode sheet;
    a first counter electrode for current collection on said first semiconductor layers;
    a second counter electrode for current collection on said second semiconductor layers; and a third counter electrode on said third semiconductor layers electrically connecting said first counter electrode and said second counter electrode, said third counter electrode having a first face and a second face,
wherein adjacent planar bifacial photovoltaic devices in said bifacial photovoltaic array are electrically connected by making contact of at least a portion of said third counter electrode of a preceding planer bifacial photovoltaic device with at least a portion of said planar core electrode sheet of subsequent planar bifacial photovoltaic device, forming a series connection of said adjacent planar, bifacial photovoltaic devices in order to increase the open circuit voltage upon illumination.

9. A bifacial photovoltaic array with simplified interconnections as defined in claim 8, further comprising a conductive epoxy being introduced between contact areas of adjacent planar bifacial photovoltaic devices to reduce contact resistance between adjacent planar bifacial photovoltaic devices.

\* \* \* \* \*